United States Patent
Huang et al.

(10) Patent No.: US 9,589,807 B1
(45) Date of Patent: Mar. 7, 2017

(54) METHOD FOR ELIMINATING INTERLAYER DIELECTRIC DISHING AND CONTROLLING GATE HEIGHT UNIFORMITY

(71) Applicant: GLOBALFOUNDRIES Inc., Grand Cayman (KY)

(72) Inventors: Haigou Huang, Rexford, NY (US); Jinping Liu, Ballston Lake, NY (US); Huang Liu, Mechanicville, NY (US); Yuanfang Lu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/164,146

(22) Filed: May 25, 2016

(51) Int. Cl.
| | |
|---|---|
| H01L 21/283 | (2006.01) |
| H01L 21/762 | (2006.01) |
| H01L 21/3213 | (2006.01) |
| H01L 29/66 | (2006.01) |

(52) U.S. Cl.
CPC ...... *H01L 21/283* (2013.01); *H01L 21/32137* (2013.01); *H01L 21/76224* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2016/0204258 A1* | 7/2016 | Yamamoto | H01L 29/665 257/194 |
| 2016/0225877 A1* | 8/2016 | Wang | H01L 29/66545 |
| 2016/0276283 A1* | 9/2016 | Zhang | H01L 21/76879 |

* cited by examiner

*Primary Examiner* — Asok K Sarkar
(74) *Attorney, Agent, or Firm* — Ditthavong & Steiner, P.C.

(57) ABSTRACT

A method for eliminating interlayer dielectric (ILD) dishing and controlling gate height uniformity is provided. Embodiments include forming a plurality of polysilicon gates over a substrate, each gate having spacers formed on sides of the polysilicon gates and a nitride cap formed on an upper surface; forming a gapfill material between adjacent polysilicon gates; forming an oxide over the gapfill material between the adjacent polysilicon gates; removing the nitride caps; removing a portion of the oxide between the adjacent polysilicon gates, forming a recess; and forming an ILD cap layer in the recess between the adjacent polysilicon gates.

20 Claims, 9 Drawing Sheets

METHOD FOR ELIMINATING INTERLAYER DIELECTRIC DISHING AND CONTROLLING GATE HEIGHT UNIFORMITY

TECHNICAL FIELD

The present disclosure relates to semiconductor fabrication. In particular, the present disclosure relates to semiconductor device fabrication in the 10 nanometer (nm) technology node and beyond.

BACKGROUND

In current semiconductor processing for 10 nm schemes, a tonen silazene (TOSZ) is used as a gapfill material between gates and a high density plasma (HDP) oxide is used as an interlayer dielectric (ILD). After dummy gate polysilicon removal, during I/O device gate oxide etch with dilute hydrofluoric acid (dHF) and chemical oxide removal (COR), about 12 nm of the ILD is lost. Another 15 nm of ILD is lost during reactive ion etching (RIE), recessing the metal gate, due to the selectivity issue of metal to oxide. In addition, 5 nm more are lost during removal of a silicon nitride (SiN) gate cap by chemical mechanical polishing. This ILD loss is referred to as ILD dishing. As a result of ILD dishing an increased polysilicon dummy gate height budget (specifically about 32 nm) is necessary to compensate for the loss of ILD material.

A need therefore exists for improved methodology that mitigates ILD dishing and effectively reduces gate height budget requirements.

SUMMARY

An aspect of the present disclosure is a method including providing a low dielectric (low-k) material as an ILD cap to prevent ILD dishing, reduce micro-loading, minimize gate height budget and improve gate height control during semiconductor processing.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a plurality of polysilicon gates over a substrate, each gate having spacers formed on sides of the polysilicon gates and a nitride cap formed on an upper surface; forming a gapfill material between adjacent polysilicon gates; forming an oxide over the gapfill material between the adjacent polysilicon gates; removing the nitride caps; removing a portion of the oxide between the adjacent polysilicon gates, forming a recess; and forming an ILD cap layer in the recess between the adjacent polysilicon gates.

Aspects of the present disclosure include forming the ILD cap layer over the entire substrate in addition to in the recess; and planarizing the ILD cap layer down to an upper surface of the adjacent polysilicon gates. Other aspects include removing the polysilicon from the polysilicon gates to expose a gate oxide at a bottom of each gate opening by RIE; and removing the gate oxide from each gate opening. Still further aspects include filling the gate openings with metal to form metal gates; and removing a portion of the metal filling from the metal gates. Certain aspects depositing a second nitride cap over the metal gates; and planarizing the second nitride to remove the ILD cap layer. Other aspects include forming the gapfill material of TOSZ. Additional aspects include forming the oxide of a HDP oxide. Certain aspects include forming the ILD cap of a low-k material. Yet further aspects include forming the ILD cap of silicon oxycarbonitride (SiOCN) or silicon oxycarbide (SiOC). Other aspects include forming the ILD cap to a thickness of 10 nm. In certain aspects, the recess is formed between the adjacent polysilicon gates to a depth of less than 10 nm.

Another aspect of the present disclosure is a method including forming a gapfill material between adjacent polysilicon gates; forming an oxide over the gapfill material between the adjacent polysilicon gates; removing nitride caps formed over the polysilicon gates; removing a portion of the oxide between the adjacent polysilicon gates, forming a recess; and forming an ILD cap layer in the recess between the adjacent polysilicon gates.

Aspects include forming the ILD cap layer over the entire substrate in addition to in the recess; removing the ILD cap layer over the adjacent polysilicon gates, wherein the ILD cap layer remains in the recess between the adjacent polysilicon gates; removing the polysilicon from the polysilicon gates to expose a gate oxide at a bottom of each gate opening by RIE; removing the gate oxide from each gate opening; metal filling the gate openings to form metal gates; removing a portion of the metal filling from the metal gates; depositing a second nitride cap over the metal gates; and planarizing the second nitride to remove the ILD cap layer. Further aspects include forming the ILD cap of SiOCN or SiOC. Other aspects include forming the ILD cap to a thickness of 10 nm. Additional aspects include forming the oxide of a HDP oxide. Still further aspects include forming the gapfill material of TOSZ. Additional aspects include forming the metal gates of tungsten (W).

Yet another aspect of the present disclosure includes forming a gapfill material between adjacent polysilicon gates; forming an oxide over the gapfill material between the adjacent polysilicon gates; removing the nitride caps; removing a portion of the oxide between the adjacent polysilicon gates to form a recess; forming an ILD cap layer over and in the recess between the adjacent polysilicon gates; removing the ILD cap layer over the adjacent polysilicon gates, wherein the ILD cap layer remains in the recess between the adjacent polysilicon gates; removing the polysilicon from the polysilicon gates to expose a gate oxide at a bottom of each gate opening by RIE; removing the gate oxide from each gate opening; metal filling the gate openings to form metal gates; removing a portion of the metal filling from the metal gates; depositing a second nitride cap over the metal gates; and planarizing the second nitride to remove the ILD cap layer.

Aspects include forming the ILD cap of SiOCN or SiOC; and forming the ILD cap to a thickness of 10 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of ILD dishing created during gate oxide etching and metal gate recessing. In accordance with embodiments of the present disclosure, a low-k cap layer composed of SiOCN or SiOC is used to prevent ILD dishing.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
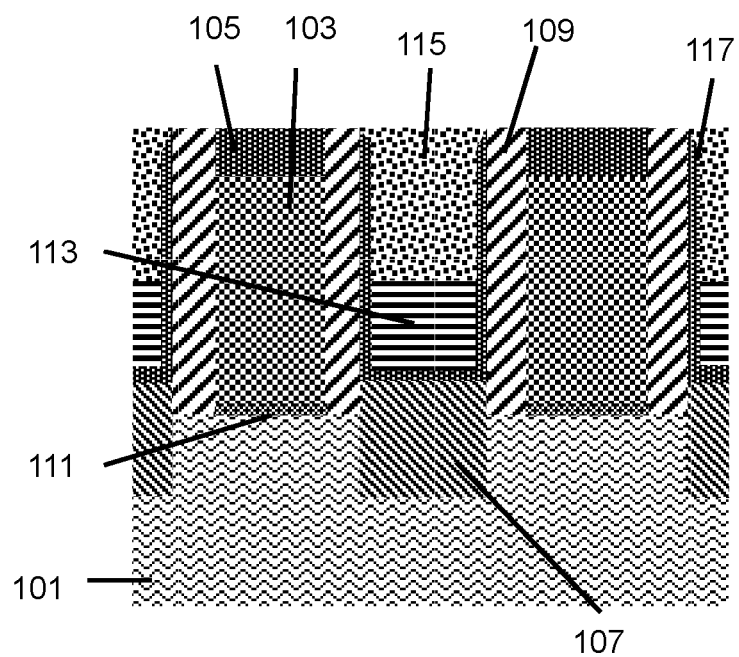
FIGS. 1 through 9 schematically illustrate a semiconductor fabrication process, in accordance with an exemplary embodiment.

Adverting to FIG. 1, a semi-conductive fin 101 is provided. The fin 101 is formed of a material such as silicon (Si), germanium (Ge), gallium arsenide (GaAs), an alloy of Si and Ge, or indium phosphide (InP). Polysilicon gates 103 are formed over the fin 101. SiN caps 105 are formed over the polysilicon gates 105. Source/drain (S/D) regions 107 are formed at opposite ends of each polysilicon gates 103. Sidewall spacers 109 are formed on the sidewalls of the polysilicon gates 103 and a gate oxide liner 111 is formed under each polysilicon gate 103. A gap fill material 113 composed of TOSZ is formed between the gates to a height of 20 to 30 nm, e.g. 28 nm, over fin 101 to prevent voids. A HDP oxide 115 is formed over the TOZS 113 to protect the TOSZ 113 during additional processing steps. The HDP oxide 115 is planarized by chemical mechanical polishing (CMP) and formed to a height of 30 to 40 nm, e.g. 40 nm, over the fin.

Figure 2:
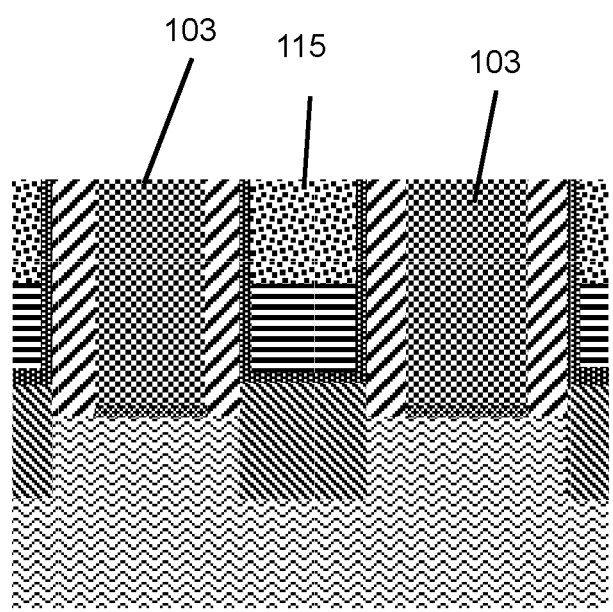
Figure 3:
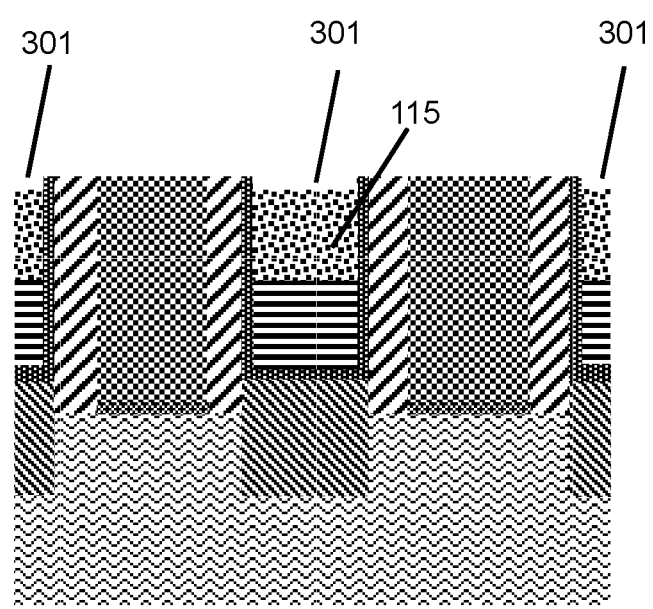

Adverting to FIG. 2, a SiN etch back is performed to remove the SiN cap 105, followed by CMP to expose an upper surface of the polysilicon gates 103 and HDP oxide 115. As shown in FIG. 3, an oxide etch is performed on the HDP oxide 115 to form a recess 301. The target depth of the recess is no larger than 10 nm.

Figure 4:
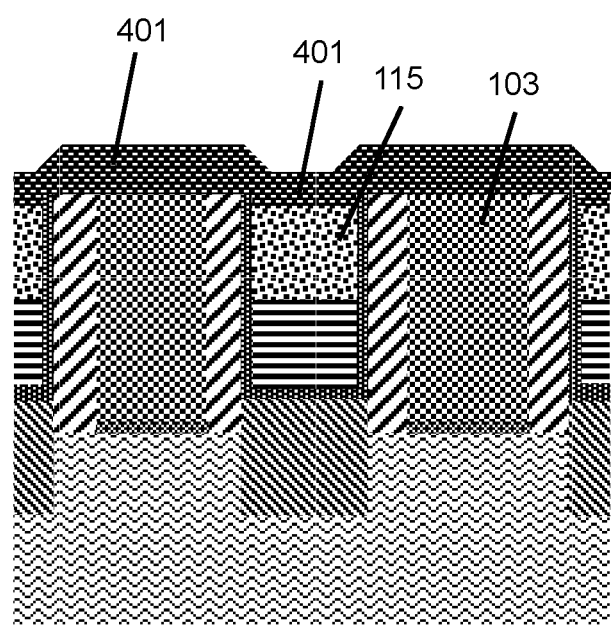
Figure 5:
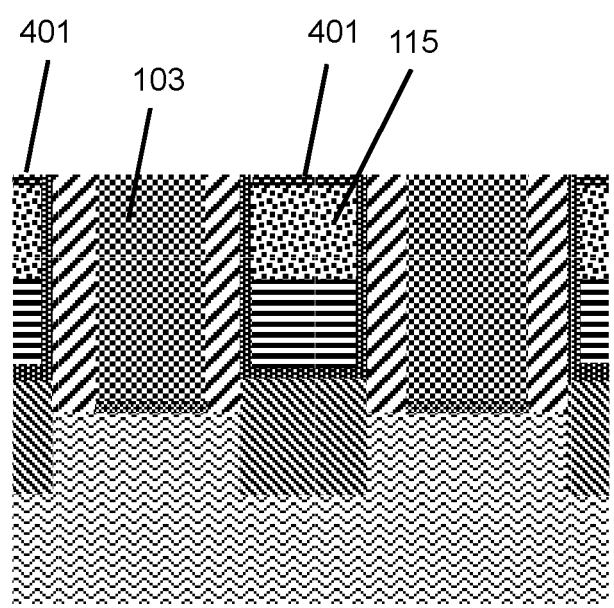

Adverting to FIG. 4, a SiOCN or SiOC cap layer 401 is blanket deposited to a thickness of 20 to 30 nm over the polysilicon gates 103 and HDP oxide 115. The SiOCN or SiOC cap layer 401 is low-k material (i.e. having a dielectric constant less than that of $SiO_2$) initially deposited as a slurry. In FIG. 5, the SiOCN or SiOC cap layer 401 is subjected to CMP, and the remaining SiOCN or SiOC cap layer 401 has a thickness of 10 nm over the HDP oxide 115. The SiOCN or SiOC cap layer 401 is removed at a slow rate to stop on the upper surface of the polysilicon gates 103. The SiOCN or SiOC cap layer 401 prevents ILD dishing of the HDP oxide 115.

Figure 6:
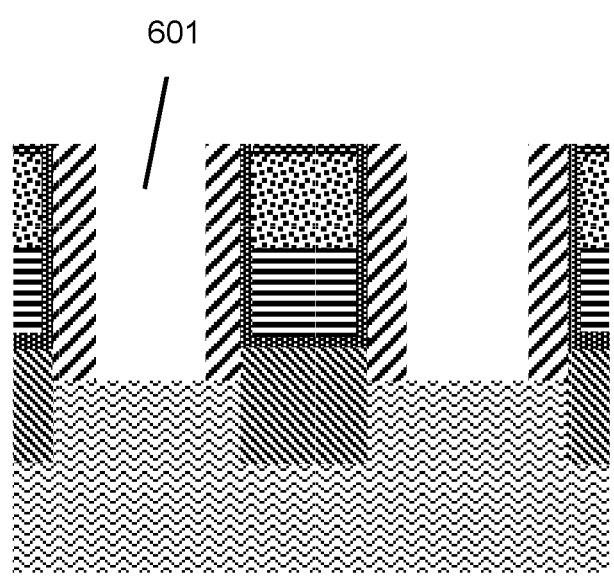
Figure 7:
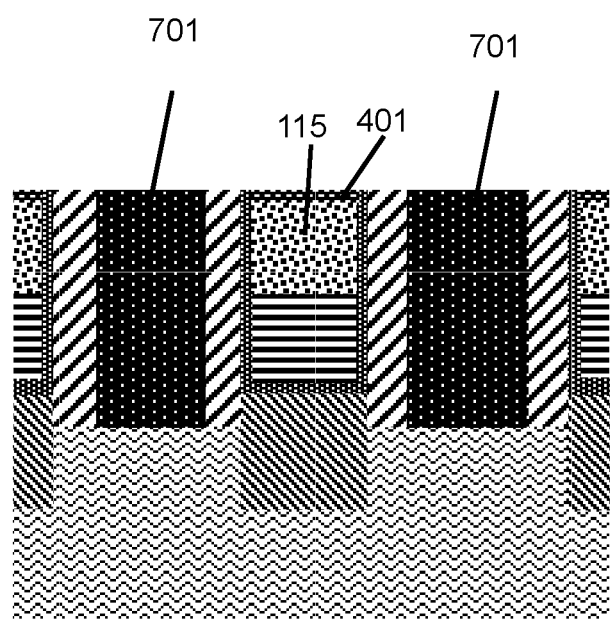

The polysilicon gates 103 are removed to form gate openings 601, as shown in FIG. 6. The gate oxide liner 111 is subject to an oxide etch and removed, as shown in FIG. 6. Without the SiOCN or SiOC cap layer 401, ILD dishing would occur during the gate oxide liner removal and result in a loss of 12 nm of the HDP oxide 115. Adverting to FIG. 7, metal gates 701 are formed in the gate openings 601. Excess metal is removed from an upper surface by CMP. The metal gate is formed of copper (Cu), titanium (Ti), tungsten (W) or tantalum (Ta).

Figure 8:
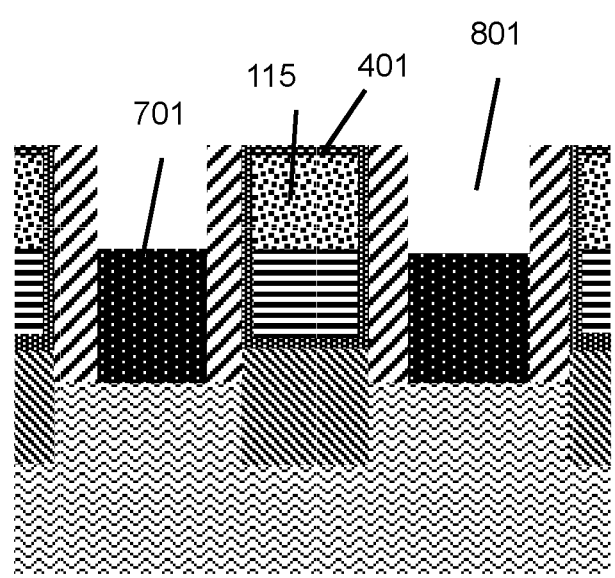
Figure 9:
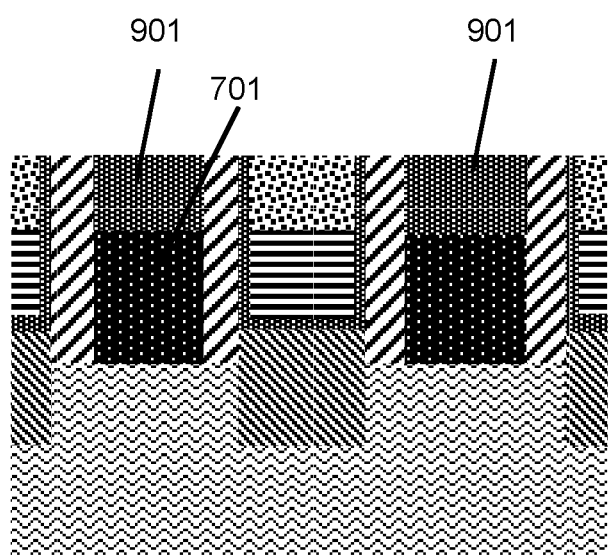

Adverting to FIG. 8, the metal gate 701 is recessed by 40-50 nm by RIE down to the height of the TOSZ to form recesses 801. The SiOCN or SiOC cap layer 401 again prevents ILD dishing of the HDP oxide 115. Without the SiOCN or SiOC cap layer 401 ILD dishing would occur and result in a loss of 15 nm of the HDP oxide 115. In FIG. 9, a SiN cap 901 is formed over each metal gate 701 for protecting the metal gate during a self-aligned contact (SAC) formation. CMP is performed to planarize the SiN cap 901 and to remove SiOCN or SiOC cap layer 401, stopping on an upper surface of the HDP oxide 115.

Since the ILD cap layer 401 protects the ILD from dishing, the ILD does not need to be thicker to compensate for the loss, and, therefore, the polysilicon gate can be formed to the desired thickness of the subsequently formed metal gate plus the SAC SiN cap. Thus, the gate height is 60 to 80 nm, for example 68 nm (28 nm for the ultimate thickness of the metal gate, plus 30 nm for the SAC SiN cap, plus 10 nm for the SiOCN or SiOC cap), over the fin. In contrast, the conventional processes have a gate height of 90 nm (28 nm for the ultimate thickness of the metal gate plus 30 nm for the SAC SiN cap plus 32 nm to compensate for the oxide loss) over the fin. The present disclosure therefore provides a gate height budget requirement that is 20 nm less than with conventional processing.

The embodiments of the present disclosure can achieve several technical effects, including eliminating ILD dishing, reducing micro-loading, minimizing gate height budget and improving gate height control during semiconductor processing. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a plurality of polysilicon gates over a substrate, each gate having spacers formed on sides of the polysilicon gates and a nitride cap formed on an upper surface;
forming a gapfill material between adjacent polysilicon gates;
forming an oxide over the gapfill material between the adjacent polysilicon gates;
removing the nitride caps;
removing a portion of the oxide between the adjacent polysilicon gates, forming a recess; and
forming an interlayer dielectric (ILD) cap layer in the recess between the adjacent polysilicon gates.

2. The method according to claim 1, further comprising:
forming the ILD cap layer over the entire substrate in addition to in the recess; and
planarizing the ILD cap layer down to an upper surface of the adjacent polysilicon gates.

3. The method according to claim 1, further comprising:
removing the polysilicon from the polysilicon gates to expose a gate oxide at a bottom of each gate opening by reactive ion etching (RIE); and
removing the gate oxide from each gate opening.

4. The method according to claim 3, further comprising:
filling the gate openings with metal to form metal gates; and
removing a portion of the metal filling from the metal gates.

5. The method according to claim 4, further comprising:
depositing a second nitride cap over the metal gates; and
planarizing the second nitride to remove the ILD cap layer.

6. The method according to claim 1, comprising forming the gapfill material of tonen silazene (TOSZ).

7. The method according to claim 6, comprising forming the oxide of a high density plasma (HDP) oxide.

8. The method according to claim 1, forming the ILD cap of a low-k material.

9. The method according to claim 8, comprising forming the ILD cap of silicon oxycarbonitride (SiOCN) or silicon oxycarbide (SiOC).

10. The method according to claim 9, comprising forming the ILD cap to a thickness of 10 nanometers (nm).

11. The method according to claim 10, comprising forming the recess between the adjacent polysilicon gates to a depth of less than 10 nm.

12. A method comprising:
forming a gapfill material between adjacent polysilicon gates;
forming an oxide over the gapfill material between the adjacent polysilicon gates;
removing nitride caps formed over the polysilicon gates;
removing a portion of the oxide between the adjacent polysilicon gates, forming a recess; and
forming an interlayer dielectric (ILD) cap layer in the recess between the adjacent polysilicon gates.

13. The method according to claim 12, further comprising:
forming the ILD cap layer over the entire substrate in addition to in the recess;
removing the ILD cap layer over the adjacent polysilicon gates, wherein the ILD cap layer remains in the recess between the adjacent polysilicon gates;
removing the polysilicon from the polysilicon gates to expose a gate oxide at a bottom of each gate opening by reactive ion etching (RIE);
removing the gate oxide from each gate opening;
metal filling the gate openings to form metal gates;
removing a portion of the metal filling from the metal gates;
depositing a second nitride cap over the metal gates; and
planarizing the second nitride to remove the ILD cap layer.

14. The method according to claim 12, comprising forming the ILD cap of silicon oxycarbonitride (SiOCN) or silicon oxycarbide (SiOC).

15. The method according to claim 13, comprising forming the ILD cap to a thickness of 10 (nm).

16. The method according to claim 12, comprising forming the oxide of a high density plasma (HDP) oxide.

17. The method according to claim 12, comprising forming the gapfill material of tonen silazene (TOSZ).

18. The method according to claim 12, comprising forming the metal gates of tungsten (W).

19. A method comprising:
forming a gapfill material between adjacent polysilicon gates;
forming an oxide over the gapfill material between the adjacent polysilicon gates;
removing the nitride caps;
removing a portion of the oxide between the adjacent polysilicon gates to form a recess;
forming an interlayer dielectric (ILD) cap layer over and in the recess between the adjacent polysilicon gates;
removing the ILD cap layer over the adjacent polysilicon gates, wherein the ILD cap layer remains in the recess between the adjacent polysilicon gates;
removing the polysilicon from the polysilicon gates to expose a gate oxide at a bottom of each gate opening by reactive ion etching (RIE);
removing the gate oxide from each gate opening;
metal filling the gate openings to form metal gates;
removing a portion of the metal filling from the metal gates;
depositing a second nitride cap over the metal gates; and
planarizing the second nitride to remove the ILD cap layer.

20. The method according to claim 19, comprising:
forming the ILD cap of silicon oxycarbonitride (SiOCN) or silicon oxycarbide (SiOC); and
forming the ILD cap to a thickness of 10 nanometers (nm).

* * * * *